(12) United States Patent
Anderson et al.

(10) Patent No.: US 6,289,496 B1
(45) Date of Patent: Sep. 11, 2001

(54) PLACEMENT OF INPUT-OUTPUT DESIGN OBJECTS INTO A PROGRAMMABLE GATE ARRAY SUPPORTING MULTIPLE VOLTAGE STANDARDS

(75) Inventors: Jason H. Anderson, Campbell; James L. Saunders, Sunnyvale; Madabhushi V. R. Chari, Milpitas; Sudip K. Nag; Rajeev Jayaraman, both of San Jose, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/107,022

(22) Filed: Jun. 29, 1998

(51) Int. Cl.[7] .................. G06F 17/50; H03K 17/693; H03K 19/173
(52) U.S. Cl. ................ 716/16; 716/17; 326/37; 326/39; 326/41; 326/47; 340/825.83
(58) Field of Search .................. 710/52; 326/50; 438/688; 700/178

(56) References Cited

U.S. PATENT DOCUMENTS

| | | | |
|---|---|---|---|
| 5,006,991 | * 4/1991 | Ohcoshi et al. | 700/178 |
| 5,843,842 | * 12/1998 | Lee et al. | 438/688 |
| 5,877,632 | * 3/1999 | Goetting et al. | 326/50 |
| 5,958,026 | * 9/1999 | Goetting et al. | 710/52 |

OTHER PUBLICATIONS

Naveed Sherwani in "Algorithms for VLSI Physical Design Automation", Second Edition, published by Kluwer Academic Publishers, 1977, pp. 175–198.

S. Kirkpatrick, C. D. Gelatt, and M. P. Vecci in "Optimization by Simulated Annealing", Science 20:671–680, May 1983.

Thomas H. Cormen, Charles E. Leiserson, and Ronald L. Rivest in "Introduction to Algorithms", McGraw Hill, 1990, pp. 600–604.

Robert Endre Tarjan in "Data Structures and Network Algorithms", Society of Inernational Applied Mathematics, 1983, pp. 113–123.

* cited by examiner

Primary Examiner—Matthew Smith
Assistant Examiner—Jibreel Speight
(74) Attorney, Agent, or Firm—LeRoy D. Manun, Esq.; Edel M. Young

(57) ABSTRACT

A method and apparatus for placement into a programmable gate array of input-output (I/O) design objects having different voltage standards. The programmable gate array has a plurality of sites arranged into banks supporting interfaces with a plurality of different input and output voltage standards. In an example embodiment, I/O design objects are placed into IOBs of the programmable gate array by first performing simulated annealing that considers conflicts between design object voltage standards as placed into the IOBs. Then, a bipartite matching is performed using placement results from simulated annealing. Finally, if the bipartite matching does not produce a feasible placement, standards are assigned to the banks based on the previous placement results, and the bipartite matching process is repeated.

15 Claims, 6 Drawing Sheets

PLACEMENT OF INPUT-OUTPUT DESIGN OBJECTS INTO A PROGRAMMABLE GATE ARRAY SUPPORTING MULTIPLE VOLTAGE STANDARDS

FIELD OF THE INVENTION

The present invention generally relates to placement of input/output (I/O) design objects into programmable gate arrays, and more particularly to placement of I/O design objects having different voltage standards into a single programmable gate array.

BACKGROUND OF THE INVENTION

Field programmable gate arrays (FPGAs), first introduced by XILINX in 1985, are becoming increasingly popular devices for use in electronics systems. For example, communications systems employ FPGAs in large measure because of the re-programmability of FPGAs. In general, the use of FPGAs continues to grow at a rapid rate because they permit relatively short design cycles, reduce costs through logic consolidation, and offer flexibility in their re-programmability.

FPGAs generally have logic blocks in the interior of the chip and input/output blocks (IOBs) around the edges of the chip. The IOBs send and receive signals off and into the chip and also receive power and ground reference voltages from off the chip. One or more clock signals may also be received for synchronizing signals generated on the chip with other signals off the chip.

The semiconductor industry standard operating voltage has in the past been 5 volts, and all devices on a system board have operated at 5 volts. Past IOBs were designed to interface with structures outside the chip using 5 volts as a power supply voltage. However, the industry is presently migrating to lower voltages for faster operation at lower power. Rather than all chips in a system operating at a single voltage, different chips operating at different power supply voltages may be placed into the same system. Therefore, it is desirable that an FPGA placed into that system be able to interface with other chips having a variety of operating voltages, and further that a user's input and output design objects can be mapped to IOBs of the FPGA.

A method and apparatus that addresses the aforementioned problems, as well as other related problems, are therefore desirable.

SUMMARY OF THE INVENTION

A method and apparatus are provided for placing input-output (I/O) design objects having different voltage standards into a programmable gate array. I/O design objects include input objects, output objects, and input/output (bidirectional) objects generated from a user's design specification, as will be recognized by those skilled in the art. The programmable gate array has a plurality of input/output blocks (IOBs) arranged into banks supporting interfaces with a plurality of different input and output voltage standards. The present invention has been found to be particularly applicable and beneficial in placing input/output (I/O) design objects into input/output blocks (IOBs) of a field programmable gate array (FPGA) operable with multiple voltage standards.

In a first embodiment, the IOBs of the programmable gate array are arranged in a plurality of banks and are able to send and receive signals at one of several input and output voltage standards. One bank of IOBs can operate at only one externally supplied output reference voltage at any one time but can include an IOB operating at a different internally supplied voltage. Similarly, one bank can operate at only one externally supplied input reference voltage. However, standards that don't require externally supplied input reference voltages may be included in the same bank. Output voltage standards are said to "conflict" or be "incompatible" if they require different externally supplied reference voltage levels. Input voltage standards are incompatible if they require different voltage levels and may also be incompatible with regard to characteristics other than voltage level. A design object can specify one input voltage standard, one output voltage standard, or both input and output voltage standards.

The method comprises: selecting respective ones of the banks for the different input voltage standards; selecting respective ones of the banks for the different output voltage standards; placing bidirectional design objects into respective IOBs of banks wherein the input and output voltage standards of a bidirectional design object are compatible with the input and output voltage standards of the bank; placing input design objects into respective IOBs of the banks, wherein the input voltage standard of an input design object is compatible with the input voltage standard of the bank in which the respective IOB is located; and placing output design objects into respective IOBs of banks, wherein the output voltage standard of the output design object is compatible with the output voltage standard of the bank in which the respective IOB is located.

In another embodiment, an apparatus is provided. The apparatus comprises: means for selecting respective ones of the banks for the different input voltage standards; means for selecting respective ones of the banks for the different output voltage standards; means for placing bidirectional design objects into respective IOBs of banks having compatible input and output voltage standard to the bidirectional design object; means for placing input design objects into respective IOBs of banks, where the input voltage standard of the input design object is compatible with the input voltage standard of the bank in which the respective IOB is located; and means for placing output design objects into respective IOBs of banks, where the output voltage standard of the output design object is compatible with the output voltage standard of the bank in which the respective IOB is located.

The above summary of the present invention is not intended to describe each disclosed embodiment of the present invention. The Figures and detailed description that follow provide additional example embodiments and aspects of the present invention.

BRIEF DESCRIPTION OF THE DRAWINGS

Other aspects and advantages of the invention will become apparent upon seeing the following detailed description and upon reference to the drawings in which.

Figure 1:
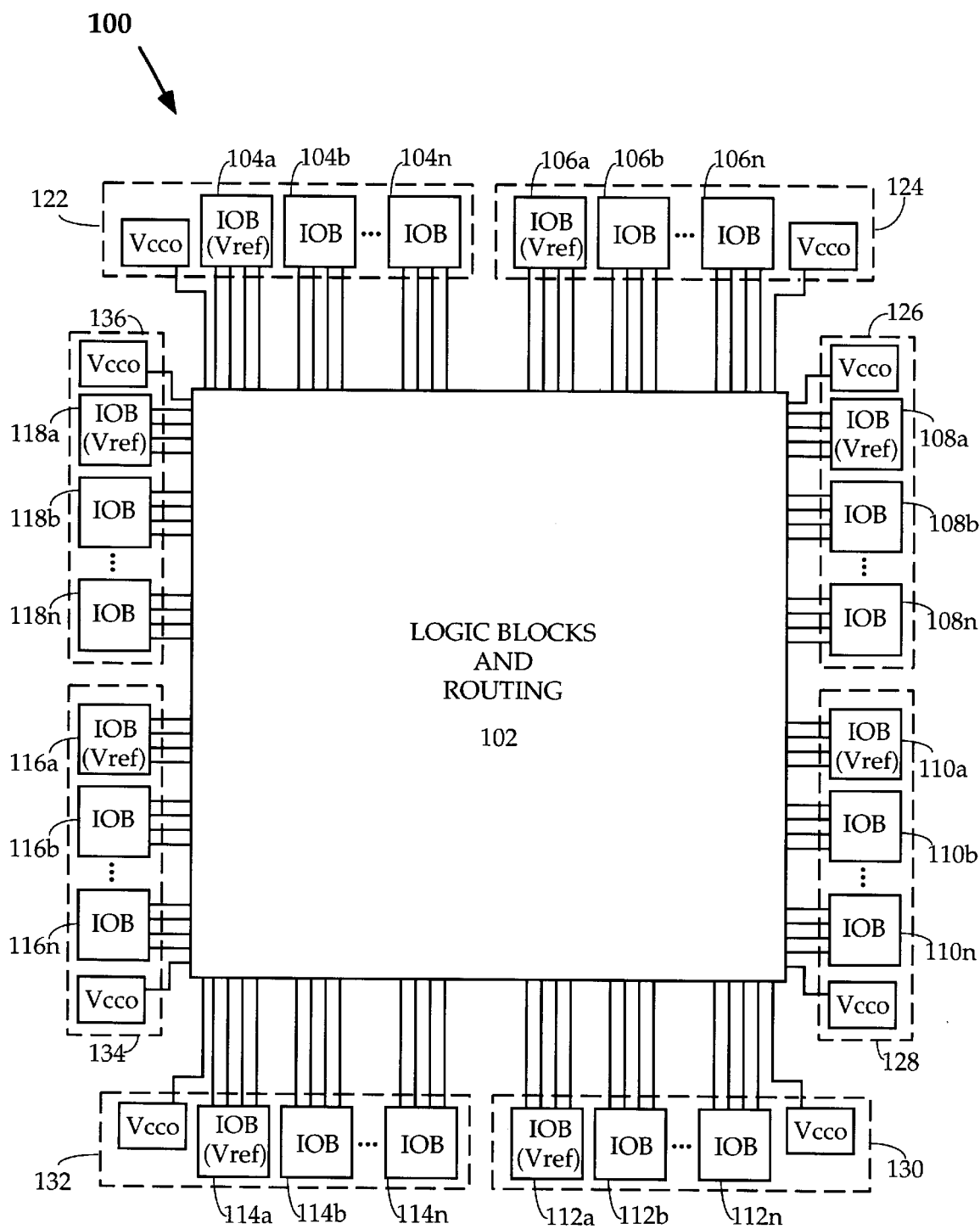
FIG. 1 is a block diagram of an example FPGA.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intent is to cover all modifications, equivalents, and alternatives falling within the spirit and scope of the invention as defined by the appended claims.

DETAILED DESCRIPTION OF THE DRAWINGS

The present invention is believed to be applicable to a variety of systems for placing design objects into programmable logic devices. The present invention has been found to be particularly applicable and beneficial in placing input/output (I/O) design objects into input/output blocks (IOBs) of a field programmable gate array (FPGA) operable with multiple voltage standards. While the present invention is not so limited, an appreciation of the present invention is presented by way of a particular example application, in this instance, in the context of an example method and apparatus for placing I/O design objects into an FPGA.

The process for implementing a user's design in an FPGA begins with specifying the user's design in machine readable format, for example with a schematic entry tool, VHDL design description, or other design entry method. Software then partitions the user's design into units that can be implemented by logic blocks and input/output blocks (IOBs) of the FPGA, places these units into particular logic blocks or IOBs, and selects metal lines that route signals from one logic block or IOB to another, in order to implement the interconnections of the user's design. The final step after placing I/O and other design objects into IOBs and logic blocks of an FPGA and selecting routing lines to interconnect the objects is to generate a bitstream to be loaded into the FPGA to turn on transistors that program the FPGA to implement the design. The process for generating a programming bitstream is accomplished with generally recognized software tools, running on various classes of computer systems that assist and automate various parts of the process. Thus it can be seen that the present invention (to place I/O design objects into the IOBs of the FPGA) relates to an intermediate part of the overall process.

I/O design objects include input objects, output objects, and input/output (bidirectional) objects generated from a user's design specification, as will be recognized by those skilled in the art. An input design object is a design object through which signals are input to the FPGA, an output design object is a design object through which signals are output from the FPGA, and an input/output (or bidirectional) design object is a design object through which signals are input and output to and from the FPGA. An input object may include a $V_{ref}$ specification that indicates an input reference voltage level for the input object; an output object may include a $V_{cco}$ specification that indicates an output reference voltage level for the output object; and input/output objects may include both $V_{ref}$ and $V_{cco}$ specifications. The $V_{ref}$ and $V_{cco}$ specifications correspond to input and output voltage standards discussed above.

The general placement rules for placing the input, output, and input/output design objects into the IOBs 104a–118n in accordance with the example embodiment of the invention are: the voltage standard of an input object cannot conflict with voltage standards of other input objects placed into other IOBs in the same bank; the voltage standard of an output object cannot conflict with voltage standards of other output objects placed into other IOBs in the same bank; and the voltage standards (input and output) of an input/output object cannot conflict with voltage standards of other input, output, or input/output objects placed in the same bank.

In addition to the general placement rules, a desirable placement of I/O design objects has acceptable wireability, wire length, and timing characteristics. Processes for measuring the wireability, wire length, timing and other characteristics are generally recognized by those skilled in the art. For example, Naveed Sherwani in "Algorithms for VLSI Physical Design Automation" published by Kluwer Academic Publishers, 1997 pp. 175–198 describes general methods for ascertaining the quality of a placement.

FIG. 1 is a block diagram of an example FPGA, such as the Virtex FPGA from XILINX, Inc., which supports 16 different voltage standards. The different input standards have different reference input voltages, and different output standards have different reference output voltages.

FPGA 100 includes section 102, which is made of logic blocks and routing, and a plurality of IOBs 104a–n, 106a–n, 108a–n, 110a–n, 112a–n, 114a–n, 116a–n, and 118a–n coupled thereto for coupling the logic blocks of section 102 to other devices. The collection of all the IOBs will be referenced as 104a–118n.

The IOBs 104a–118n are grouped into banks 122, 124, 126, 128, 130, 132, 134, and 136. I/O design objects in each of banks 122–136 must have compatible input voltage standards and output voltage standards. However, different banks may simultaneously operate at different voltage standards, if required by a user's design.

Each bank 122–136 has one or more IOBs referred to as $V_{ref}$ IOBs. The $V_{ref}$ IOBs are used to supply an input reference voltage if required by an input voltage standard associated with an I/O design object in the bank. If a bank does not contain any I/O design objects that require an externally supplied input reference voltage, the $V_{ref}$ IOBs in the bank can be used as regular IOB locations.

In the embodiment of FIG. 1, for output standards, each bank of the FPGA 100 has one or more $V_{cco}$ pads (one shown) for receiving a reference voltage to be used for the output voltage. The $V_{cco}$ pads are dedicated for supplying output voltages and cannot be used for regular I/O design object locations.

As indicated above, the banks 122–136 may operate at different voltage standards according to a user's design. A bank can contain I/O design objects with different voltage standards, as long as the standards of the design objects are compatible. Thus, for example, bank 122 can be operable with input voltage standard GTL and output voltage standard CTT, bank 124 can be operable with input voltage standard PCI and output voltage standard HSTL-I, where the different input and output voltage standards are specified in a user's design. It will be appreciated that multiple ones of banks 122–136 can operate at the same voltage standards if required by a user's design.

Figure 2:
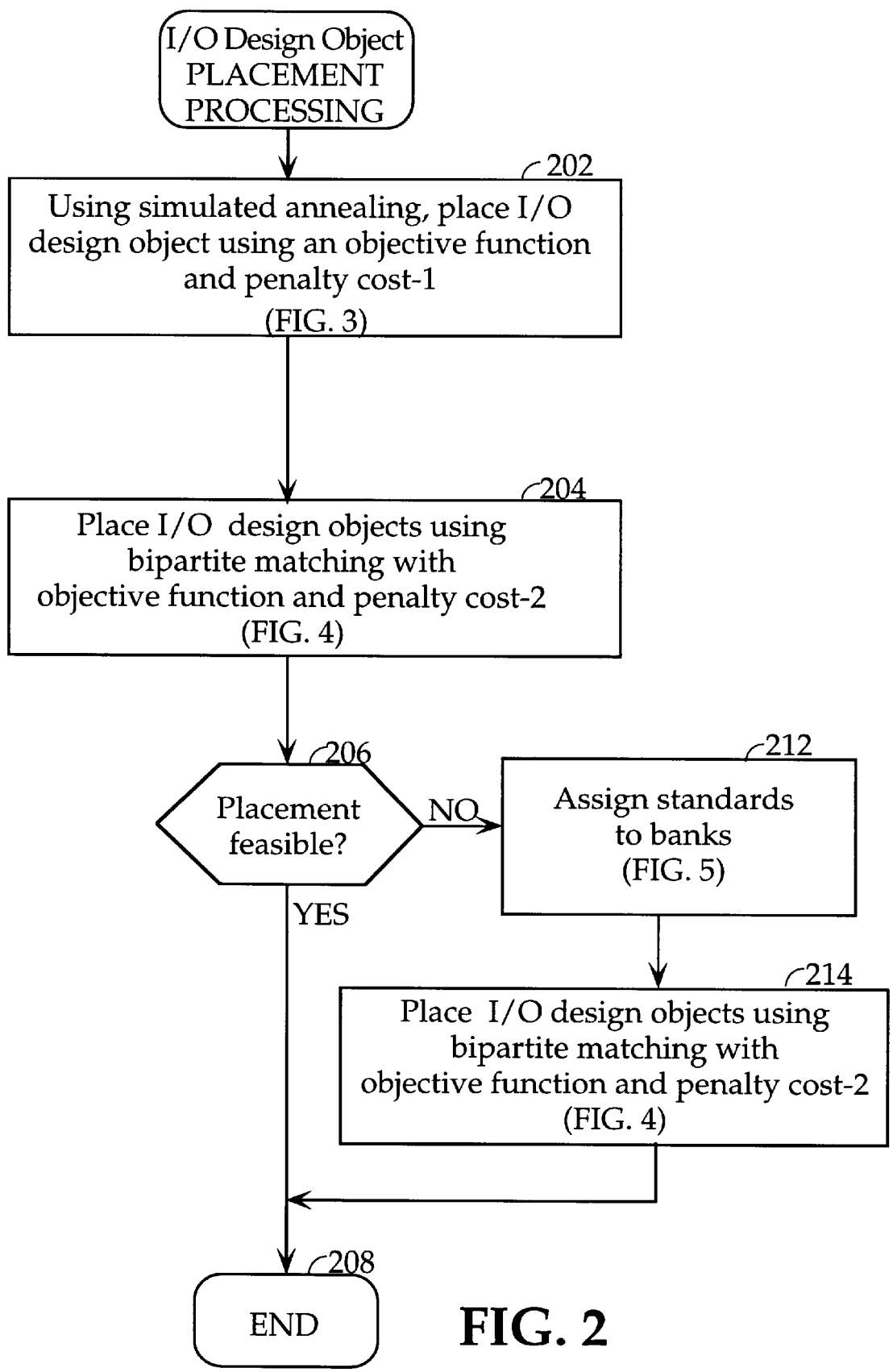
FIG. 2 is a flowchart of a method for placement of I/O design objects into IOBs of an FPGA in accordance with an example embodiment of the present invention.

The present invention places I/O design objects into sites 104a–118n of an FPGA 100 while optimizing the overall placement, in accordance with an example embodiment shown in FIG. 2. The placement of input, output, and input/output objects is done such that the quality characteristics are generally optimized and the placement rules are observed. A placement of input, output, and input/output design objects where the placement rules are not violated is called a "feasible" placement.

The example placement processing of FIG. 2 generally includes three phases.

In a first phase of processing shown at step 202, the objects are placed using "simulated annealing." The annealing process is an optimization process for non-linear optimization problems and works well in considering placement of objects into IOBs 104a–118n. The annealing process may produce a result that is feasible. In some cases, however, the result may violate a few placement rules, but the result will be close to a feasible placement.

The annealing process determines a quality factor and a penalty cost-1 (a first cost function that allows some movement to places of higher cost) for each considered placement. A combination of the quality factor and the penalty cost-1 is used to determine whether to place a particular object into a particular IOB. The penalty cost-1 includes a function of any conflicts between the voltage standard of the object and the voltage standards of other objects that are already placed into IOBs within the same bank as the particular IOB. The simulated annealing of step 202 is described further in FIG. 3.

A second phase is then used for placing I/O design objects, as shown in step 204. The second phase of processing includes bipartite matching. Bipartite matching is a process of matching items in a first list to items in a second list. Here, there is a cost associated with any matching or pairing of two items. The bipartite matching algorithm pairs items to minimize the sum of all these costs. Matching between the I/O design objects and the IOBs uses the previously described objective function and another penalty cost function, referred to as the "penalty cost-2." The bipartite matching process and penalty cost-2 function are described further in the discussion accompanying FIG. 4. Generally, the bipartite matching process uses the voltage standards of the objects placed into IOBs and their respective banks from the annealing processing and attempts to place the objects such that the voltage standards of the objects do not conflict with the banks into which they are placed.

Figure 4:
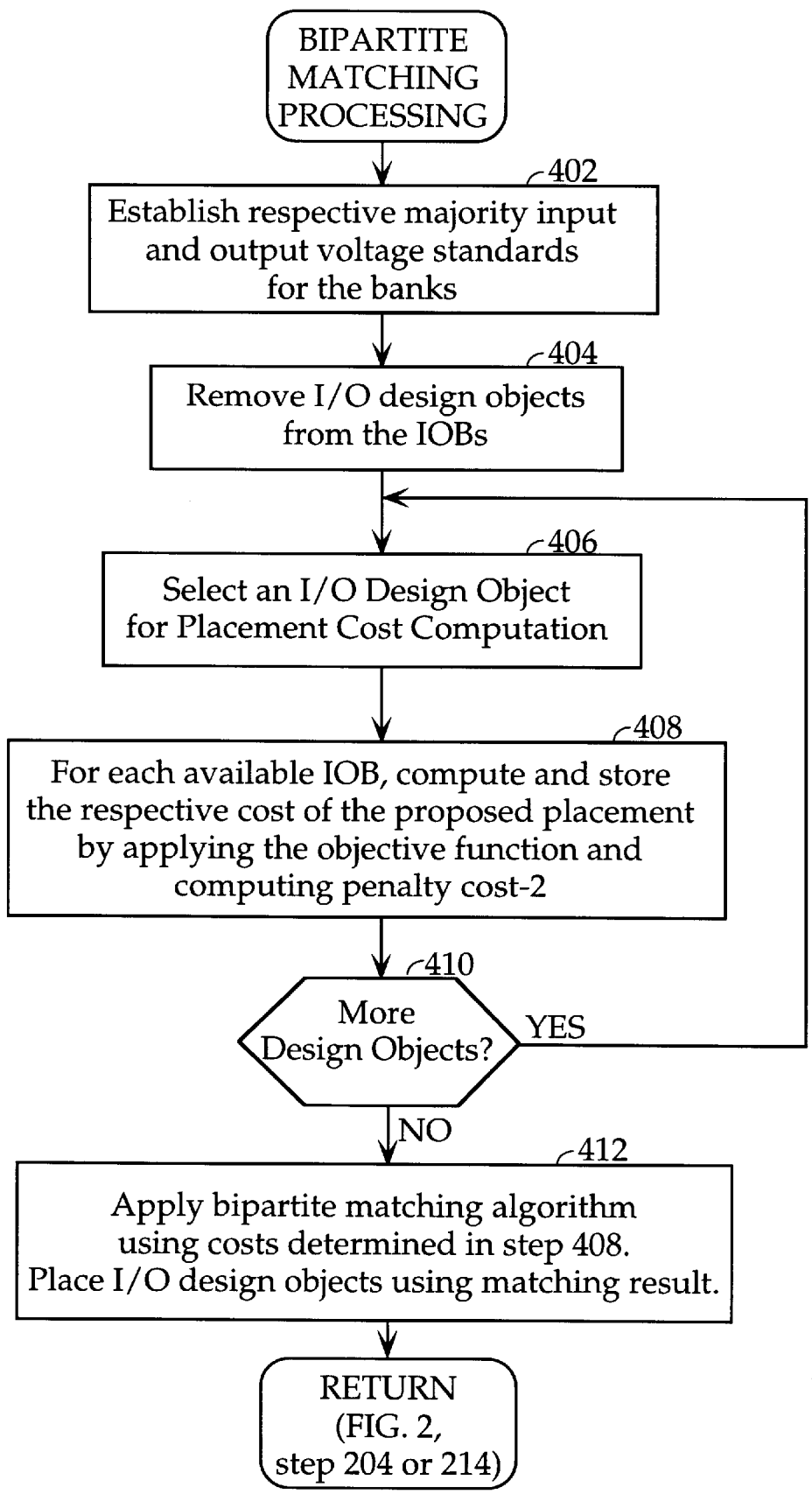
FIG. 4 is a flowchart of a process for bipartite matching of I/O design objects to FPGA IOBs according to an example embodiment of the invention.

If at step 206, all I/O design objects have been placed, and the placement is feasible, then processing is complete. Otherwise, control is directed to steps 212 and 214 where the third phase of the processing is performed. In the final phase of processing, all the voltage standards are assigned to banks based on the assignments from the simulated annealing processing and the banks having the greatest number of design objects for the required voltage standards. The processing of step 212 is further described below in the discussion that accompanies FIGS. 5 and 6. Lastly, the bipartite matching processing of FIG. 4 is repeated as shown by step 214.

Figure 3:
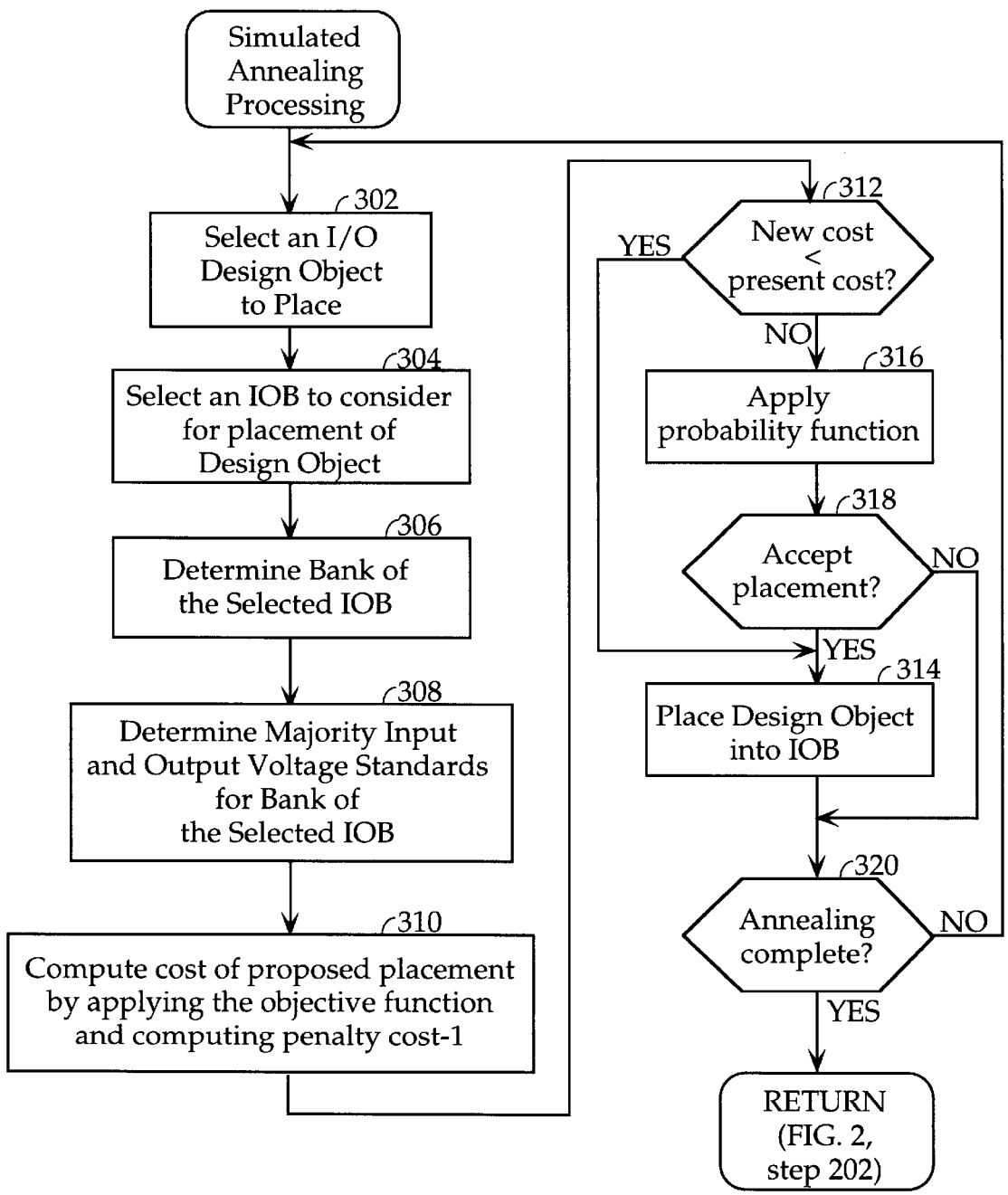
FIG. 3 is a flowchart of an example process for performing a first phase of placement of I/O design objects.

FIG. 3 is a flowchart of a process for performing the first phase of simulated annealing processing for placement of I/O design objects. The first phase of processing uses simulated annealing to satisfy voltage standards requirements while optimizing placement. Example methods for simulated annealing are described by S. Kirkpatrick, C. D. Gelatt, and M. P. Vecci in "Optimization by Simulated Annealing", Science 220:671–680, May 1983.

Simulated annealing is an iterative process which begins with an initial arbitrary placement of I/O design objects into IOBs 104a–118n. An I/O design object is selected at step 302 and placement of the I/O design object into an arbitrary one of the IOBs 104a–118n is considered at step 304. A minimum cost function is used to determine whether to place the selected I/O design object into the selected IOB. The cost function is:

Cost=Objective function+Penalty cost-1

The objective function yields a quantification of the quality of placing I/O design objects into the FPGA. The objective function includes several terms, each term indicative of a selected quality characteristic of the placement. Example terms reflect the quality of wireability, wire length, and timing characteristics. The Naveed Sherwani book, ibid, can be consulted for a discussion of suitable objective functions.

If the cost of the proposed placement is less than the cost of the present placement, then the I/O design object is placed into the selected IOB. If another I/O design object does not already occupy the IOB, the I/O design object will be placed into the IOB. If another I/O design object occupies the IOB, the new cost is computed where the selected I/O design object is assumed to be placed into the selected IOB, and the I/O design object already in the selected IOB is assumed to be placed into the IOB of the selected I/O design object. In other words, the new cost is computed based on swapping placement of the selected I/O design object and another I/O design object.

In addition to the objective function, the voltage standards of the I/O design objects and the placement of the I/O design objects into banks of the FPGA are factored into the decision of placing an I/O design object. In the example embodiment, the process associates a penalty cost (referred to as "penalty cost-1") with a proposed placement where a voltage standard of the I/O design object to be placed conflicts with a voltage standard already associated with a bank by previously assigned I/O design objects. At the end of placing the I/O design objects, it is an objective to reduce the penalty cost-1 to zero. That is, when all the I/O design objects have been placed in the annealing process, the voltage standards of the I/O design objects are compatible with the voltage standards associated with the IOB banks of the FPGA. It will be appreciated, however, that it is possible that the penalty cost-1 will not be reduced to zero. The penalty cost-1 factor essentially factors the feasibility of a proposed placement of an I/O design object with respect to the voltage standard of the I/O design object.

An example penalty cost-1 function is:

Penalty cost-1=$W_c$*C+$W_s$*S where $W_c$ and $W_s$ are weighting factors,
C=number of design objects with voltage standards that conflict with the voltage standards associated with the banks containing the design objects; and
S=number of $V_{ref}$ IOBs in the design.

That is, the penalty cost-1 is a pre-selected weighting factor multiplied by the number of I/O design objects in the banks where voltage standards are in conflict, plus a second pre-selected weighting factor multiplied by the total number of $V_{ref}$ IOBs used in the design. It is desirable to place I/O design objects that require $V_{ref}$ IOBs into the fewest possible number of banks. Because annealing seeks to minimize the sum of the objective function and the penalty cost-1 function, proper selection of the weighting factors is important. Weighting factors that are too high may cause the annealing process to weight the penalty cost extremely high relative to the objective function, thereby causing annealing to minimize the penalty costs at the expense of the objective function, thereby resulting in poor timing and wireability characteristics. On the other hand, weighting factors that are too small may provide acceptable timing and wireability but reduce the chances of finding a feasible solution for the I/O design objects. Example weighting factors are $W_c$=200, and $W_s$=100.

Step 306 determines the bank in which the IOB is grouped, and step 308 determines the majority input and output voltage standards for the bank if the I/O design object were to be placed into the IOB. A majority input voltage standard for a bank 122–136 (FIG. 1) is defined as the input voltage standard common to a majority of I/O design objects that are placed into the IOBs 104a–118n of the bank. Similarly, a majority output voltage standard is defined as the output voltage standard common to a majority of I/O design objects that are placed into the IOBs of the bank.

At step 310, the cost of the proposed placement is determined as described above.

If the cost of the proposed placement is less than the cost of the present placement, step 312 directs control to step 314 where the I/O design object is placed into the selected IOB. Otherwise, control is directed to step 316.

If the new cost is not less than the present cost, the proposed placement may be accepted even though the result of the objective function is greater. One of the characteristics of simulated annealing is that it allows a controlled acceptance of moves which increase the cost. Early in the annealing process it is more likely than later in the annealing process that a move with a resulting increase in cost is accepted. To implement this feature, a "probability" function is applied to the result of the objective function of the proposed placement, as described by Kirkpatrick et al, ibid.

At step 316, the probability function is applied. If the result of the probability function is within an acceptable range, step 318 directs control to step 314. Otherwise, the I/O design object is not placed into the IOB, and control is directed to decision step 320. Decision step 320 tests whether annealing is complete with generally known techniques, and when annealing is complete, control is returned to step 202 of FIG. 2.

FIG. 4 is a flowchart of a process for bipartite matching of I/O design objects to FPGA IOBs according to an example embodiment of the invention. The bipartite matching process attempts to place I/O design objects into IOBs 104a–118n within banks 122–136 in a manner that minimizes the objective function without conflicting with voltage standards of the banks.

The bipartite matching process first considers the overall placement that resulted from the annealing process. For each of the banks, a majority input voltage standard and a majority output voltage standard are established at step 402.

At step 404, the I/O design objects are removed from placement into the IOBs 104a-118n. The I/O design objects will then be placed again according to the bipartite matching process. An I/O design object is selected for computation of costs at step 406, and at step 408 respective costs are computed for placement of the I/O design object into the IOBs 104a–118n. The respective costs are stored in a table, for example, for later use in bipartite matching. The cost function for bipartite matching is similar to the cost function for the simulated annealing. However, the penalty cost function is different. The cost function is:

Cost=objective function+penalty cost-2

The objective function is the same as that previously described. The penalty cost-2 function is used to inhibit placement of an I/O design object into a IOB 104a–118n if the voltage standard(s) of the I/O design object do not match the voltage standards of the bank 122–136 in which the IOB is located. Thus, the penalty cost-2 function returns a very large number when there is a conflict. Otherwise, the penalty cost-2 function returns 0. The selected penalty cost-2 function does not allow placing an I/O design object into a IOB of a bank having voltage standards that conflict with the voltage standard(s) of the I/O design object.

While there are still more I/O design objects for which to compute costs, step 410 returns control to step 406. When costs for all the I/O design objects have been computed, control is directed to step 412.

A generally known bipartite matching is performed on the costs associated with all the I/O design objects and the IOBs 104a–118n. The bipartite matching provides a placement of all I/O design objects such that the overall cost is minimized, where the overall cost is, for example, the sum of the individual placement costs of the I/O design objects into the IOBs selected for the placement. Bipartite matching methods such as those described by Thomas H. Cormen, Charles, E. Leiserson, and Ronald L. Rivest in "Introduction to Algorithms", McGraw Hill, 1997 1990, pp. 600–604 or by Robert Endre Tarjan in "Data Structures and Network Algorithms", Society of International Applied Mathematics, 1983pp. 113–123, for example, are acceptable. When bipartite matching is complete, control is returned to step 204 of FIG. 2.

Figure 5:
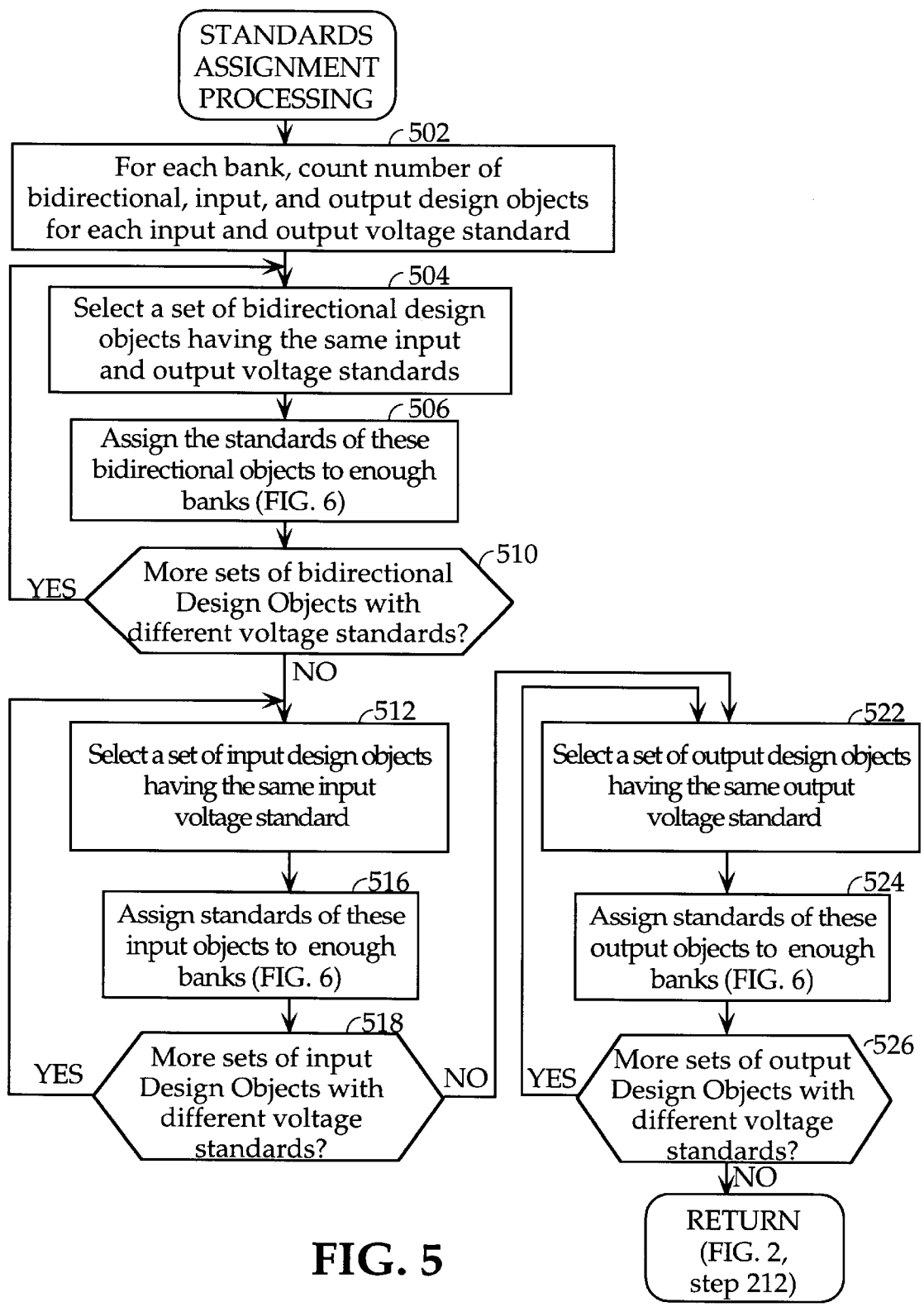
FIG. 5 is a flowchart of an example method for assigning voltage standards required by a design to banks of an FPGA.

FIG. 5 is a flowchart of an example method for assigning voltage standards required by a design to banks 122–136 of an FPGA 100. If the bipartite matching process fails to find a feasible placement of I/O design objects into banks, a third phase of processing is performed wherein the voltage standards are assigned to banks based on the previously attempted placements.

For example, assume a set of the bidirectional design objects has the input voltage standard AGP and the output voltage standard AGP. The processing determines, based on the placement after simulated annealing, which bank has the most bidirectional design objects with the AGP input and output voltage standards. Input voltage standard AGP and output voltage standard AGP are then assigned to that bank. Depending on how many bidirectional design objects are in the set, it may be necessary to assign the AGP voltage standard to more than one bank. The process is then repeated for bidirectional I/O design objects having different voltage standards.

The process begins at step 502 where, for each of the banks 122–136, the I/O design objects already placed into IOBs of the banks are counted for each of the following:

bidirectional design objects with specific input and output voltage standards, input design objects with specific input voltage standards, and output design objects with specific output voltage standards. For example, consider the following placement of I/O design objects into banks:

Bank 1: B(CTT), B(CTT), B(CTT), I(GTL)
Bank 2: B(AGP), B(AGP)
Bank 3: B(CTT), B(CTT)
Bank 4: I(HSTL-I), I(HSTL-I), I(SSTL3-I)
Bank 5: O(LVCMOS2), O(PCI), O(LVCMOS2)
Bank 6: I(HSTL-I)
Bank 7: empty
Bank 8: O(PCI), O(PCI), O(LVCMOS2)

The letters B, I, and O represent bidirectional, input, and output design objects, respectively. The voltage standard associated with the object is shown in parentheses. For bidirectional design objects, the input voltage standard and the output voltage standard have the same name, though, as previously discussed, the bidirectional objects have separate input and output voltage standards.

After the I/O design objects are counted as described above, the standards assignment processing proceeds to assign standards to banks, first for sets of bidirectional design objects, second for sets of input design objects, and last for sets of output design objects. At step 504, a set of bidirectional design objects having the same input and output voltage standards is selected, and its input and output voltage standards are determined. At step 506, standards are assigned to banks, as further described in FIG. 6.

Figure 6:
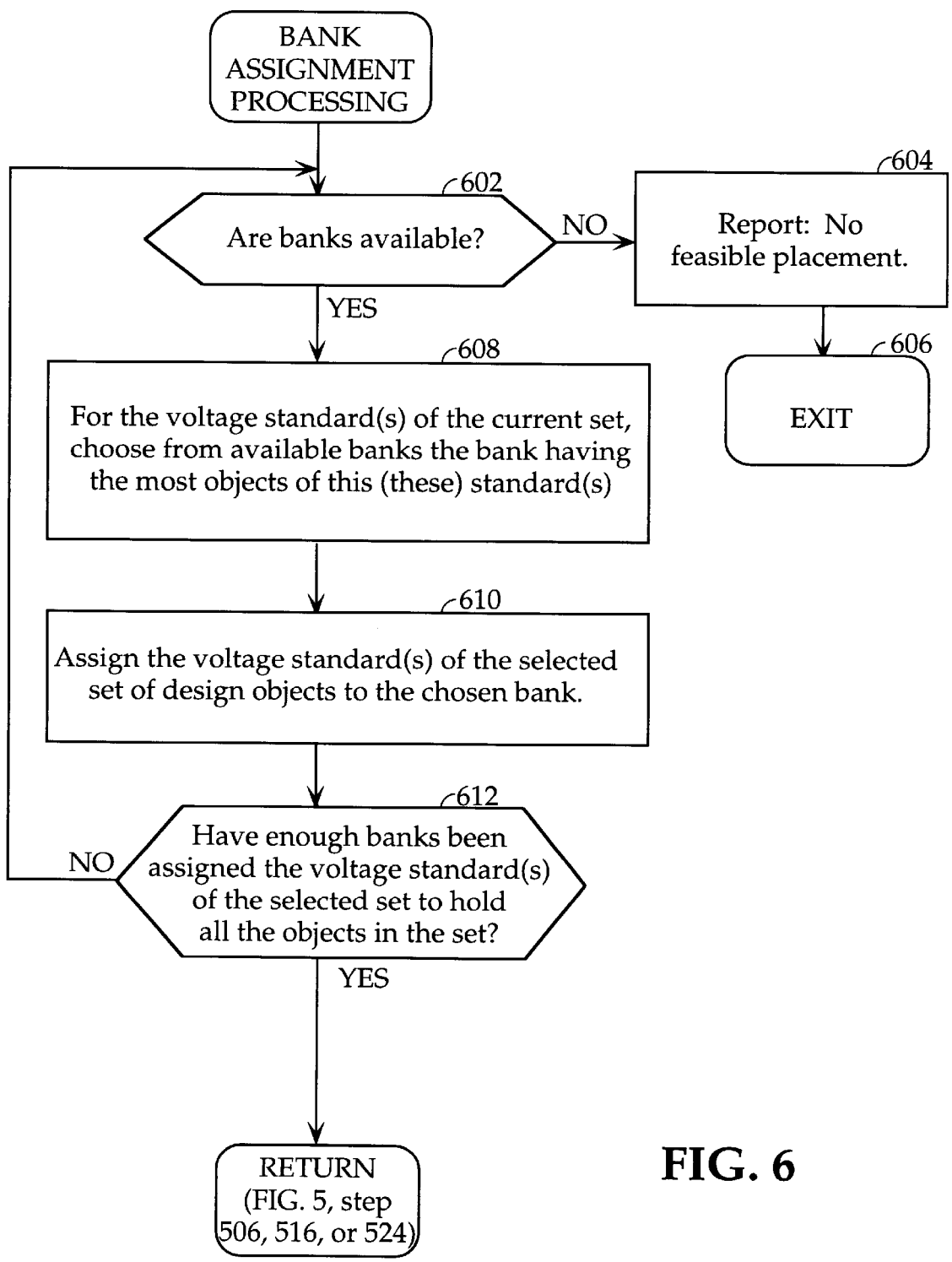
FIG. 6 shows a flowchart of an example method for selecting banks for receiving voltage standards.

As shown in FIG. 6, at step 602, there is a determination of whether banks are available that can be assigned the standards of bidirectional design objects. If no bank is available, at step 604 a report is made that there is no feasible placement, and the process exits at step 606. Assuming that banks are available, at step 608, the bank having the greatest number of bidirectional design objects with the input voltage standard and output voltage standard of the selected bidirectional design object set is determined. For counting objects in the bidirectional case, the count for the input voltage standard and the count for the output voltage standard may be added together, or alternatively, the number of design objects in the bank having standards that exactly match the proposed set may be counted. Continuing with the example set forth in the previous paragraph, the selected set of bidirectional design objects is five objects having the input and output voltage standards CTT. The count of bidirectional design objects with input and output voltage standards CTT is 3 for bank 1 and 2 for bank 3. Thus, at step 608, bank 1 is chosen as the bank containing the largest number of matching bidirectional design objects. And at step 610, the input and output voltage standards CTT are assigned to bank 1, chosen at step 608. At step 612 a determination is made of whether the number of banks assigned these voltage standards are sufficient to hold the set. If not, control returns to step 602, and if more banks are determined to be available, at step 608, the voltage standards of the selected set (in the above example voltage standards CTT) are assigned to the additional banks.

In the above example, if there are not enough IOBs in bank 1 to accommodate all five bidirectional design objects in the set, a second bank will be needed. Since, after simulated annealing bank 3 contained 2 objects with the CTT input and output standards, bank 3 will be assigned these standards. After a determination is made at step 612 that an adequate number of banks have been assigned the voltage standards of the bidirectional set, control is returned to step 510 of FIG. 5. While there are more sets of bidirectional design objects with different voltage standards, step 510 returns control to step 504.

Eventually, all bidirectional standards are assigned and at step 512, processing of voltage standards of the input design objects begins. Similarly to step 504, at step 512, a set of input design objects having the same input voltage standard is selected, and at step 516 standards for these input objects are assigned to banks using the process of FIG. 6.

As with bidirectional objects, the process of FIG. 6 begins at step 602 to test whether banks are available. A bank is available to accommodate a set of input design objects if either the bank has no input standard associated with it, or the bank has been assigned an input standard during bidirectional processing that is compatible with the input standard of the selected set of input design objects. At step 608, the process now finds the bank 122–136 having the greatest number of input or bidirectional design objects with input voltage standards that match the voltage standard of the selected set of input design objects. For another example, the count of input plus bidirectional design objects in bank 4 having input voltage standard HSTL-I is 2 and the number in bank 6 having this standard is 1. The process is followed for input design objects as discussed above for bidirectional design objects, returning to step 516 of FIG. 5 and at step 518 repeating the loop until all the different input voltage standards have been processed.

The same process is then followed at steps 522 and 524 for sets of output design objects having the same output voltage standards. For example, the count of output design objects having output voltage standard PCI is 1 in bank 5 and 2 in bank 8. After enough banks are assigned, FIG. 6 returns control to step 524 until all the different output voltage standards have been processed.

In one embodiment, the set of input design objects having a particular standard is assigned to a bank in which bidirectional objects having compatible input standards are assigned. In another embodiment, the set of input design objects having a particular standard is assigned to a bank having no bidirectional design objects. In yet another embodiment, the set of input design objects having a particular standard is assigned to a bank having other input design objects of the same input standard. And, of course, in another embodiment, input design objects compatible with a variety of standards are assigned to banks using those standards. And a set of I/O design objects may be broken up into multiple banks even when breaking them up is not required. Alternative embodiments of output design object assignment are also included within the scope of the invention.

When all the voltage standards have been assigned to banks 122–136 of the FPGA 100, control is returned to step 212 of FIG. 2, and bipartite matching is again performed to place the I/O design objects as described above.

Accordingly, the present invention provides, among other aspects, a method and system for placement of I/O design objects into a programmable gate array. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for placement of input, output, and bidirectional design objects into IOBs of a programmable gate array, the IOBs of the programmable gate array arranged in a plurality of banks programmable to send and receive signals at a plurality of input and output voltage standards and wherein the design objects specify at least one input voltage standard or at least one output voltage standard, comprising:

selecting respective ones of the banks for the different input voltage standards;

selecting respective ones of the banks for the different output voltage standards;

placing input design objects into respective IOBs of banks to minimize penalty cost of the placement, wherein the input voltage standard of the input design object is compatible with the input voltage standard of the bank in which the respective IOB is located; and placing output design objects into respective IOBs of banks to minimize penalty cost of the placement, wherein the output voltage standard of the output design object is compatible with the output voltage standard of the bank in which the respective IOB is located.

2. The method of claim 1, further comprising placing bidirectional design objects into respective IOBs of banks to minimize penalty cost of the placement, wherein the input voltage standard of the bidirectional design object is compatible with the input voltage standard of the bank in which the respective IOB is located, and the output voltage standard of the bidirectional design object is compatible with the output voltage standard of the bank in which the respective IOB is located.

3. The method of claim 1, further comprising:

establishing an initial arbitrary placement of I/O design objects into the respective IOBs to provide an initial placement;

selecting one of the I/O design objects;

selecting an IOB for consideration for placement of the I/O design object;

determining the bank in which the IOB is located;

determining which input standard and which output standard are common to a majority of I/O design objects that are located in the IOBs of the bank if the I/O design object were to be placed into the IOB;

determining a hypothetical placement cost if the I/O design object were to be placed into the IOB, the cost being a function of conflicts between the voltage standard of the I/O design object and voltage standards of other I/O design objects presently placed into other IOBs of the bank; and placing the I/O design object into the IOB to provide a new placement if the hypothetical placement cost is acceptable.

4. The method of claim 3, wherein the cost is further a function of a total number of I/O design objects in banks with conflicting voltage standards.

5. The method of claim 4, wherein the cost is further a function of a total number of $V_{ref}$ IOBs required by the I/O design objects.

6. The method of claim 5, wherein the cost is further a function of (a first predetermined weighting factor) multiplied by (number of design objects with voltage standards that conflict with the voltage standards associated with the banks containing the design objects)+(a second predetermined weighting factor) multiplied by (the total number of $V_{ref}$ IOBs required by the I/O design objects).

7. The method of claim 3, further comprising:

establishing respective majority input and output voltage standards for the banks, wherein a majority input standard for a particular bank is an input standard common to a plurality of the I/O design objects placed into IOBs of the particular bank, and the majority output standard for a particular bank is an output standard common to a plurality of the I/O design objects placed into IOBs of the particular bank;

removing the I/O design objects from the present placement;

establishing respective placement costs of all I/O design objects into all IOBs;

placing the I/O design objects into the IOBs such that an overall placement cost is minimized.

8. The method of claim 1, wherein the overall placement cost is a function of conflicts between the voltage standards of the input and output design objects and voltage standards of the majority of input and output voltage standards of the banks.

9. The method of claim 2, further comprising:

establishing respective majority input and output voltage standards for the banks, wherein a majority input standard for a particular bank is an input standard common to a plurality of the input and output design objects placed into IOBs of the particular bank, and a majority output standard for a particular bank is an output standard common to a plurality of the input and output design objects placed into IOBs of the particular bank;

removing the input and output design objects from the present placement;

establishing respective placement costs of all input and output design objects into all IOBs;

placing the input and output design objects into the IOBs such that an overall placement cost is minimized.

10. The method of claim 9, further comprising:

assigning input and output voltage standards of bidirectional design objects to respective banks, each respective bank having a greatest number of design objects having one of the input and output voltage standards placed therein;

assigning voltage standards of input design objects to respective banks, each respective bank having a greatest number of design objects placed thereon for one of the different input voltage standards;

assigning different voltage standards of output design objects to respective banks, each respective bank having a greatest number of design objects placed thereon for one of the different output voltage standards; and then removing the design objects from the present placement;

establishing respective placement costs of all design objects into all IOBs; and placing the design objects into the IOBs such that an overall placement cost is minimized.

11. An apparatus for placement of input, output, and bidirectional design objects into IOBs of a programmable gate array, the IOBs of the programmable gate array being located in a plurality of banks programmable to send and receive signals at a plurality of input and output voltage standards, each bank including selected ones of the IOBs, wherein the design objects specify at least one input voltage standard or at least one output voltage standard, comprising:

means for selecting input voltaae standards for respective ones of the banks;

means for selecting output voltage standards for respective ones of the banks;

means for placing input design objects into respective IOBs of the banks to minimize penalty cost of the placement, wherein the input voltage standard of the input design object is compatible with the input voltage standard of the bank in which the respective IOB is located; and means for placing output design objects into respective IOBs of banks to minimize penalty cost of the placement, wherein the output voltage standard of the output design object is compatible with the output voltage standard of the bank in which the respective IOB is located.

12. The apparatus as in claim 11 wherein at least one design object specifies both one input voltage standard and one output voltage standard.

13. A method for placement of input, output, and bidirectional design objects into IOBs of a programmable gate array, the IOBs of the programmable gate array arranged in a plurality of banks programmable to send and receive signals at a plurality of input and output voltage standards and wherein the design objects specify at least one input voltage standard or at least one output voltage standard, comprising:

selecting input voltage standards for respective ones of the banks in a way that optimizes placement of a design into the programmable gate array;

selecting output voltage standards for respective ones of the banks in a way that optimizes placement of a design into the programmable gate array;

placing input design objects into respective IOBs of banks, wherein the input voltage standard of the input design object is compatible with the input voltage standard of the bank in which the respective IOB is located; and placing output design objects into respective IOBs of banks, wherein the output voltage standard of the output design object is compatible with the output voltage standard of the bank in which the respective IOB is located.

14. A method for placement of input, output, and bidirectional design objects into IOBs of a programmable gate array, the IOBs of the programmable gate array arranged in a plurality of banks programmable to send and receive signals at a plurality of input and output voltage standards and wherein the design objects specify at least one input voltage standard or at least one output voltage standard, comprising:

generating an intermediate placement of the input and output design objects on the IOBs that permits mixing of input voltage standard within a bank and mixing of output voltage standards within a bank;

assigning input voltage standards and output voltage standards to the banks as a function of the intermediate placement; and generating a final placement of the input design objects and output design objects while minimizing cost of a final placement, wherein the input voltage standard of each input design object is compatible with the input voltage standard of the bank of IOBs in which input design object is placed, and the output voltage standard of each output design object is compatible with the output voltage standard of the bank of IOBs in which output design object is placed.

15. The method of claim 14, further comprising:

generating an intermediate placement of the bidirectional design objects on the IOBs while permitting mixing of input voltage standard within a bank and mixing of output voltage standards within a bank;

placing bidirectional design objects into respective IOBs of banks for a final placement that minimizes cost of the placement, wherein the input voltage standard of the bidirectional design object is compatible with the input voltage standard of the bank in which the respective IOB is located, and the output voltage standard of the bidirectional design object is compatible with the output voltage standard of the bank in which the respective IOB is located.

* * * * *